(12) United States Patent
Sugaya et al.

(10) Patent No.: US 8,856,722 B2
(45) Date of Patent: Oct. 7, 2014

(54) SYSTEM FOR SEMICONDUCTOR DEVICE, METHOD FOR MANUFACTURING SEMICONDUCTOR DEVICE, SEMICONDUCTOR DEVICE AND METHOD FOR BONDING SUBSTRATES

(71) Applicant: Nikon Corporation, Tokyo (JP)

(72) Inventors: Isao Sugaya, Kawasaki (JP); Takahiro Horikoshi, Chofu (JP); Kazuya Okamoto, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/732,796

(22) Filed: Jan. 2, 2013

(65) Prior Publication Data

US 2013/0191806 A1 Jul. 25, 2013
US 2014/0181781 A2 Jun. 26, 2014

Related U.S. Application Data

(63) Continuation of application No. 12/879,826, filed on Sep. 10, 2010, now Pat. No. 8,370,789, which is a continuation of application No. PCT/JP2009/001115, filed on Mar. 12, 2009.

(30) Foreign Application Priority Data

Mar. 13, 2008 (JP) ................................ 2008-064924

(51) Int. Cl.
*G06F 17/50* (2006.01)
*B29C 65/00* (2006.01)
*B29C 65/78* (2006.01)
*B32B 37/00* (2006.01)
*B32B 41/00* (2006.01)
*B65C 9/00* (2006.01)
*H01L 23/00* (2006.01)
*H01L 25/00* (2006.01)
*H01L 21/67* (2006.01)

(52) U.S. Cl.
CPC ... *G06F 17/5081* (2013.01); *H01L 2924/01006* (2013.01); *H01L 2924/01074* (2013.01); *H01L 2924/01004* (2013.01); *H01L 2224/16* (2013.01); *H01L 2224/7592* (2013.01); *H01L 2924/01041* (2013.01); *H01L 2225/06541* (2013.01); *H01L 24/75* (2013.01); *H01L 2225/06513* (2013.01); *H01L 2924/01005* (2013.01); *H01L 21/67092* (2013.01); *H01L 2224/75251* (2013.01); *H01L 25/50* (2013.01); *G06F 17/5068* (2013.01); *H01L 2924/01082* (2013.01); *H01L 2924/01033* (2013.01); *H01L 2224/75252* (2013.01)
USPC ............................ 716/137; 156/349; 156/378

(58) Field of Classification Search
USPC ................................... 716/137; 156/349, 378
See application file for complete search history.

(56) References Cited

U.S. PATENT DOCUMENTS 6,145,117 A * 11/2000 Eng ................................ 716/105
6,216,252 B1 * 4/2001 Dangelo et al. ................ 716/102

(Continued)

*Primary Examiner* — Suresh Memula
(74) *Attorney, Agent, or Firm* — Finnegan, Henderson, Farabow, Garrett & Dunner, LLP

(57) ABSTRACT

The terminals that oppose each other when substrates are bonded are designed to be reliably joined. Comprised in a semiconductor device design system are a numerical value acquiring part, which acquires the respective numerical values of a plurality of calculation parameters, a junction estimating part, which, in the case in which a plurality of substrates has been pressed at a prescribed pressure so that the bump front end faces come into contact, estimates whether or not the respective mutually opposing bumps will be joined based on the respective numerical values of the calculation parameters acquired by the numerical value acquiring part, and a change processing part, which, in the case in which it has been estimated by the junction estimating part that any of the bumps will not be joined, gives a warning or performs processing so as to change the numerical value of at least one calculation parameter among the plurality of calculation parameters.

23 Claims, 10 Drawing Sheets

(56) References Cited

U.S. PATENT DOCUMENTS

| | | | |
|---|---|---|---|
| 6,836,877 B1* | 12/2004 | Dupenloup | 716/103 |
| 2006/0220230 A1* | 10/2006 | Tanaka et al. | 257/723 |
| 2007/0150846 A1* | 6/2007 | Furnish et al. | 716/8 |
| 2007/0245280 A1* | 10/2007 | Van Eijk et al. | 716/9 |
| 2008/0276212 A1* | 11/2008 | Albrecht | 716/10 |
| 2011/0042013 A1 | 2/2011 | Sokolov et al. | |

* cited by examiner

SYSTEM FOR SEMICONDUCTOR DEVICE, METHOD FOR MANUFACTURING SEMICONDUCTOR DEVICE, SEMICONDUCTOR DEVICE AND METHOD FOR BONDING SUBSTRATES

CROSS REFERENCE TO RELATED APPLICATIONS

This is a continuation application of Ser. No. 12/879,826 filed on Sep. 10, 2010, which is a continuation application of PCT/JP2009/001115 filed on Mar. 12, 2009 which claims priority from a Japanese Patent Application No. 2008-064924 filed on Mar. 13, 2008.

BACKGROUND

1. Technical Field

The present invention relates to a semiconductor device design system, a semiconductor device manufacturing method, a semiconductor device and a substrate bonding apparatus. The present invention particularly relates to a semiconductor device design system manufactured by means of bonding a plurality of substrates, a semiconductor device manufacturing method, a semiconductor device and a substrate bonding apparatus.

2. Related Art

In semiconductor devices, there are those that bond and three-dimensionally laminate a plurality of substrates to improve the performance of said devices without increasing the area of the device overall. In the case in which a plurality of substrates are to be bonded, electrical connection between the substrates is performed by terminals called "bumps," which are disposed on the respective substrates, being joined (for example, see Japanese Unexamined Patent Application Publication No. 2007-115978).

However, when there is variation in the heights of the bumps disposed on the substrate, there is no joining between the low bumps, and junction defects occur.

Therefore, the purpose is to provide a semiconductor device design system, a semiconductor device manufacturing method, a semiconductor device and a substrate bonding apparatus that are able to solve the above problems. This purpose is achieved by combinations of special characteristics described in the independent claims of the Scope of Patent Claims. In addition, dependent claims define further advantageous specific examples of the present invention.

SUMMARY

In order solve the above problems, provided in the first mode of the present invention is a semiconductor device design system comprising a numerical value acquiring part, which acquires the numerical value of at least one calculation parameter, a junction estimating part that, in the case in which, between at least two substrates on which a plurality of terminals has been provided, the respective substrates are pressed at a prescribed pressure so that the front end faces of the respective mutually corresponding terminals come into contact, estimates whether or not the respective mutually opposing terminals will be respectively joined based on the numerical values of the calculation parameters acquired by the numerical value acquiring part, and a change processing part which, in the case in which it has been estimated by the junction estimating part that any of the respective terminals will not be joined, gives a warning or performs processing so as to change the numerical value of at least one of the calculation parameters from among the calculation parameters acquired by the numerical value acquiring part.

In addition, provided in the second mode of the present invention is a semiconductor device manufacturing method comprising a numerical value acquiring stage, which acquires the numerical value of at least one calculation parameter, a junction estimating stage, which, in the case in which at least two substrates on which a plurality of terminals has been provided are pressed at a prescribed pressure so that the front end faces of the respective mutually corresponding terminals come into contact between the two substrates, estimates whether or not the respective mutually opposing terminals will be respectively joined based on the numerical values of the calculation parameters acquired by the numerical value acquiring stage, and a change processing stage which, in the case in which it has been estimated by the junction estimating stage that any of the respective terminals will not be joined, gives a warning or performs processing so as to change the numerical value of at least one of the calculation parameters from among the calculation parameters acquired by the numerical value acquiring stage.

Provided in the third mode of the present invention is a semiconductor device manufactured by means of a numerical value acquiring stage, which acquires the numerical value of at least one calculation parameter, a junction estimating stage, which, in the case in which at least two substrates on which a plurality of terminals has been provided are pressed at a prescribed pressure so that the front end faces of the respective mutually corresponding terminals come into contact between the two substrates, estimates whether or not the respective mutually opposing terminals will be respectively joined based on the numerical values of the calculation parameters acquired by the numerical value acquiring stage, and a change processing stage which, in the case in which it has been estimated by the junction estimating stage that any of the respective terminals will not be joined, gives a warning or performs processing so as to change the numerical value of at least one of the calculation parameters from among the calculation parameters acquired by the numerical value acquiring stage.

Provided in the fourth mode of the present invention is a substrate bonding apparatus comprising a first substrate holding part, which holds a first substrate that has a plurality of terminals, a second substrate holding part, which holds a second substrate that has a plurality of terminals, a numerical value input part, which inputs the numerical value of at least one calculation parameter, a calculating part, which calculates the amount of compression of the respective terminals and the amount of bending of the respective substrates when the first substrate and the second substrate are pressed so that the front end faces of the respective terminals of the first substrate come into contact with the front end faces of corresponding terminals among the respective terminals of the second substrate based on the numerical values of the calculation parameters input from the numerical value input part, a parameter determining part, which determines a process parameter value so that the total of the compression amount and the bending amount calculated by the calculating part becomes larger than a prescribed value, and a pressing part, which presses the first substrate, which is held by the first substrate holding part, and the second substrate, which is held by the second substrate holding part, so that the front end faces of the respective terminals of the first substrate and the front end faces of the respective terminals of the second substrate come into contact based on the process parameter value determined by the parameter determining part.

Note that the above outline of the invention does not enumerate all of the required special characteristics of the present invention. In addition, sub-combination of these special characteristics groups may also result in the present invention.

DESCRIPTION OF EXEMPLARY EMBODIMENTS

The present invention will be described via the embodiments of the invention, but the embodiments below do not limit the inventions relating to the claims, and there is no limitation to the effect that all of the combinations of the features described in the embodiments are indispensable to the resolution means of the invention.

Figure 1:
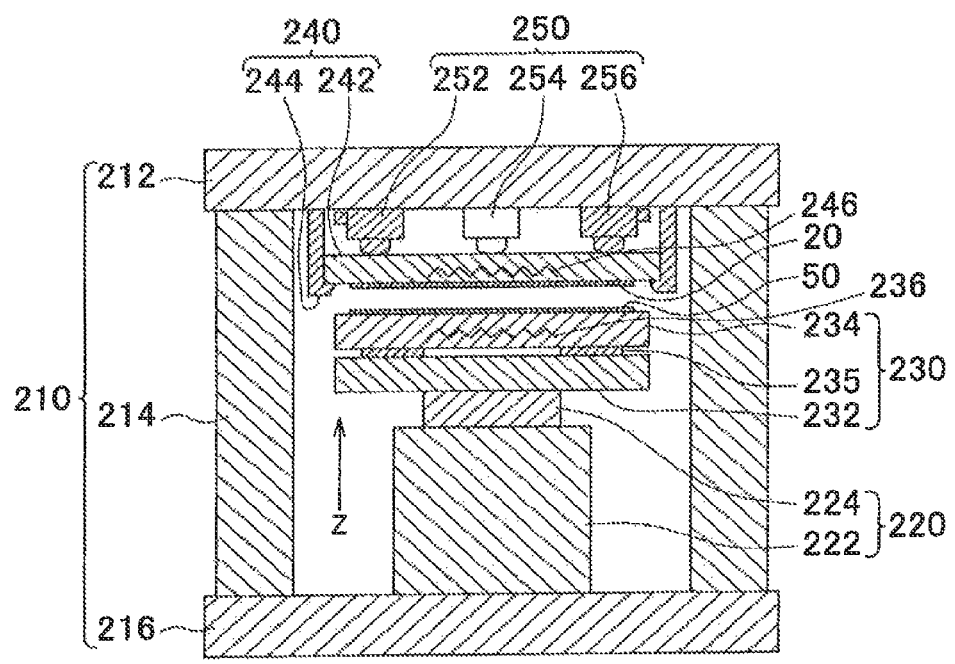
FIG. 1 is a cross-sectional view that schematically shows the structure of a substrate bonding apparatus 200.

FIG. 1 is a cross-sectional view that schematically shows the structure of a substrate bonding apparatus 200. The substrate bonding apparatus 200 manufactures a three-dimensional semiconductor apparatus by bonding substrates 20, 50, on which a plurality of functional elements have been formed, by pressure application and heating. The respective substrates 20, 50 are, in the example of the drawing, respectively comprised by wafers that have conventionally been well known. The substrate bonding apparatus 200 comprises a pressing part 220, a pressure applying stage 230, a pressure receiving stage 240 and a pressure detecting part 250 arranged at the inside of a frame body 210.

The frame body 210 comprises a ceiling plate 212 and a bottom plate 216 that are mutually parallel and horizontal, and a plurality of support columns 214, which join the ceiling plate 212 and the bottom plate 216. The ceiling plate 212, the support columns 214 and the bottom plate 216 are respectively formed by highly rigid materials, and deformation does not occur even in the case in which a reaction force of the pressure application acts on the substrates 20, 50.

At the inside of the frame body 210, the pressing part 220 is arranged on the bottom plate 216. The pressing part 220 has a cylinder 222 fixed to the upper surface of the bottom plate 216 and a piston 224 arranged at the inside of the cylinder 222. The piston 224 is driven by means of a fluid circuit, a cam and a wheel train, which are not shown, and is raised and lowered in a direction at a right angle to the bottom plate 216, which is shown by arrow Z in the drawing.

At the upper end of the piston 224, the pressure applying stage 230 is mounted. The pressure applying stage 230 has a horizontal plate-shaped support part 232, which is joined to the upper end of the piston 224, and a plate-shaped first substrate holding part 234, which is parallel to the support part 232.

The first substrate holding part 234 is supported from the support part 232 via a plurality of actuators 235. The actuators 235, in addition to the pair of actuators 235 that have been illustrated, are arranged frontward and rearward with respect to the bottom surface. In addition, these respective actuators 235 are also able to operate mutually independently. By means of such a structure, it is possible to change the inclination of the first substrate holding part 234 as desired by appropriately operating the actuators 235. In addition, the first substrate holding part 234 has a heater 236 and is heated by means of said heater 236.

Note that the first substrate holding part 234 is such that a substrate 50 is chucked to the upper surface by means of electrostatic chucking, vacuum chucking, etc. The substrate 50, which has been chucked to the first substrate holding part 234 in this way, shakes along with the first substrate holding part 234 while movement or falling from the first substrate holding part 234 is restricted.

The pressure receiving stage 240 has a second substrate holding part 242 and a plurality of suspension parts 244. The suspension parts 244 are hung down vertically from the lower surface of the ceiling plate 212. The second substrate holding part 242 is supported from below in the vicinity of the lower ends of the suspension parts 244 and is arranged in opposition to the pressure applying stage 230. In addition, the second substrate holding part 242 also has a chucking mechanism resulting from electrostatic chucking, negative pressure chucking, etc. and chucks a substrate 20 to the lower surface. In addition, the suspension parts 244 have a heater 246 and are heated by said heater 246.

The second substrate holding part 242 is supported by the suspension parts 244 from below while movement upward is not restricted. However, a plurality of load cells 252, 254, 256 are interposed between the ceiling plate 212 and the second substrate holding part 242. The plurality of load cells 252, 254, 256 form a part of the pressure detecting part 250 to restrict upward movement of the second substrate holding part 242, while detecting pressure applied upward with respect to the second substrate holding part 242.

The status shown in FIG. 1 is such that, in this status, the piston 224 of the pressing part 220 is pulled into the cylinder 222, and the pressure applying stage 230 is in a lowered status. Therefore, there is a wide gap between the pressure applying stage 230 and the pressure receiving stage 240.

One of the substrates 50 among the pair of substrates 20, 50 subject to joining is inserted into the gap from the side and is loaded onto the pressure applying stage 230. The other substrate 20 is also similarly inserted and is held by the pressure receiving stage 240 in opposition with substrate 50. Substrates 20 and 50 are mutually aligned within a plane orthogonal to the Z directions. Note that the substrate bonding apparatus 200 may align substrates 20 and 50, and substrates 20 and 50, which have been aligned by another alignment apparatus, may also be transported to the substrate bonding apparatus 200.

Here, the pressure applying stage 230 rises toward the pressure receiving stage 240 and presses substrate 20 and substrate 50. In addition, during pressing, heaters 246 and 236 heat the pressure applying stage 230 and the pressure receiving stage 240. Through this, substrates 20 and 50 are joined.

Figure 2A:
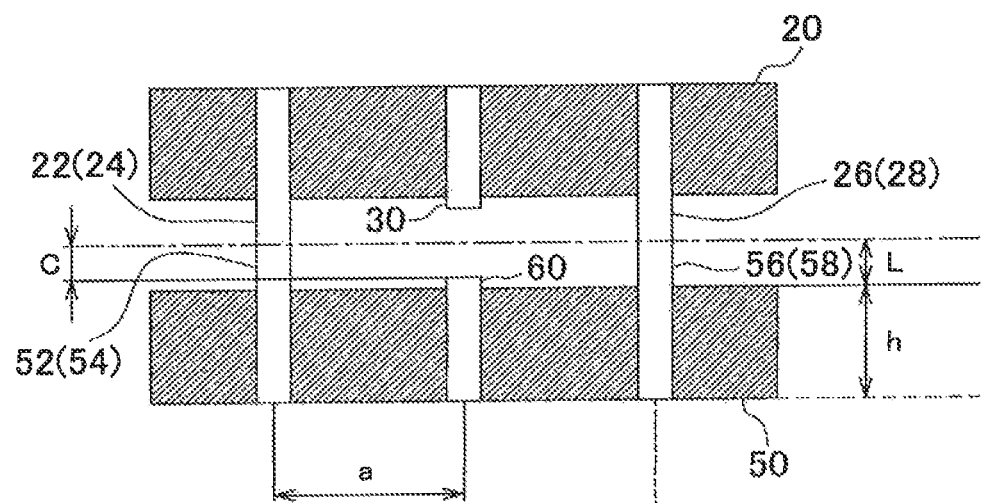
FIG. 2(a) is a cross-sectional view that schematically shows substrates 20 and 50.
Figure 2B:
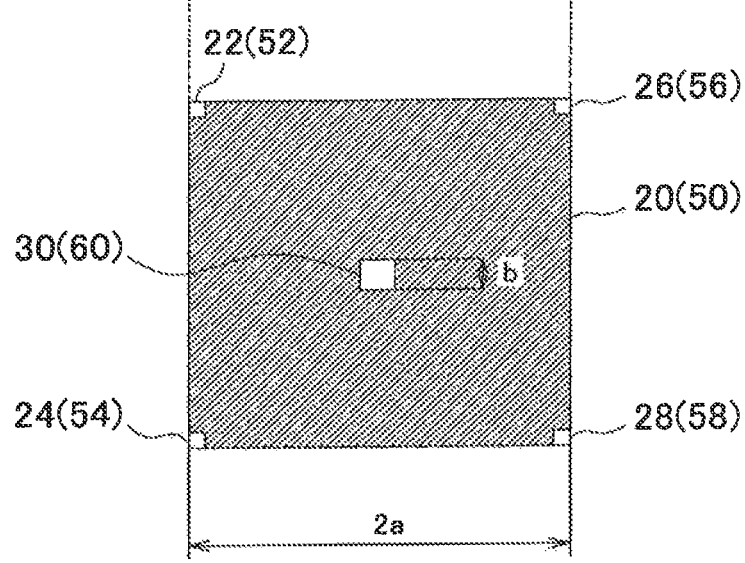
FIG. 2(b) is a plan view thereof.

FIG. 2 schematically shows substrates 20 and 50, which have been bonded by the substrate bonding apparatus 200, where FIG. 2(a) is a cross-sectional view of substrates 20 and 50, and FIG. 2(b) is a plan view thereof. A plurality of functional elements is formed on substrate 20. The functional elements of substrate 20 have a plurality of through-substrate vias that pass through in the thickness directions and a plurality of bumps 22, 24, 26,28, 30 provided on said through-substrate vias. Similarly, a plurality of semiconductor apparatuses is formed on substrate 50 as well. The functional elements of substrate 50 are arranged at positions opposing bumps 22, 24, 26, 28 and 30 of substrate 20 and have a plurality of through-substrate vias that pass through in the thickness directions and a plurality of bumps 52, 54, 56, 58, 60 provided on said through-substrate vias. By these opposing bumps 22, 52, etc. being joined by pressing in the case in which substrate 20 and substrate 50 are to be bonded, an electrical connection is made between substrate 20 and bump 52. These bumps 22, 24, 26, 28, 30, 52, 54, 56, 58, 60 (hereunder, referred to as "bumps 22, etc.") are examples of the terminals.

However, there is variation between the heights of these bumps 22, etc. resulting from manufacturing error, etc. of the bumps 22[, etc.] In the example shown in FIG. 2, the center bumps 30, 60 from among the bumps 22, etc. disposed at a height L, a width b and a pitch a are lower than the bumps 22, 52, etc. of the periphery by a height C. Therefore, at the relative distance of substrates 20 and 50 at which the front end face of bump 22 and the front end face of bump 52 just come into contact, bump 30 and bump 60 are separated and are not mutually electrically connected.

Here, when substrate 20 and substrate 50 are further pressed, the front end face of bump 30 and the front end face of bump 60 approach each other due to compression of bumps 22, etc. and bending of substrate 20, etc., but whether or not these will be joined depends upon the amount of compression of bumps 22, etc. and the amount of bending of substrates 20, etc. Therefore, the present embodiment designs a layout of a semiconductor device on substrates 20 and 50 that have a compression amount of bumps 22, etc. and a bending amount of substrates 20, etc. at which the respective front end faces of the respective corresponding bumps 22, 52 are joined.

Figure 3:
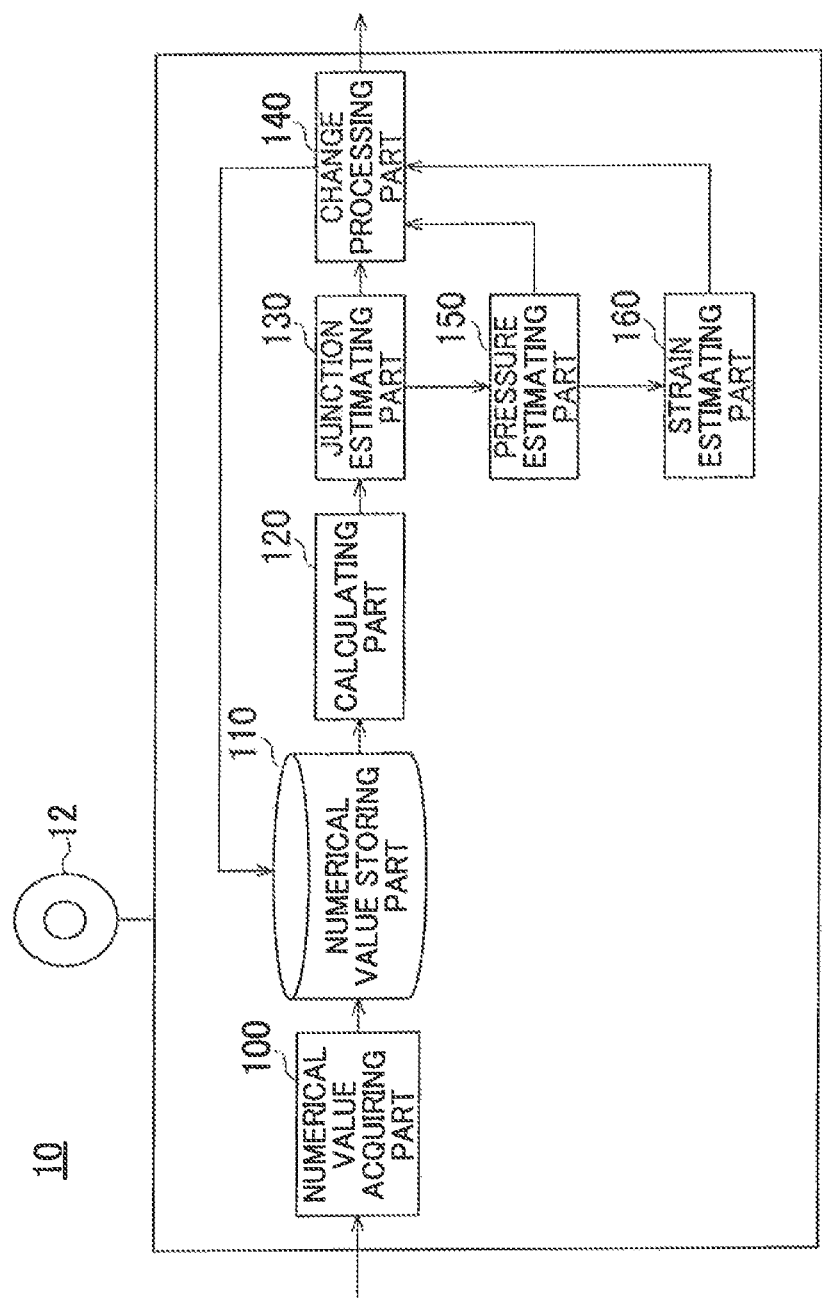
FIG. 3 shows a functional block of a design system 10.

FIG. 3 shows a functional block of a design system 10 that designs a layout of a semiconductor device on substrates 20 and 50. The design system 10 has a numerical value acquiring part 100, which acquires the numerical values of calculation parameters, a numerical value storing part 110, which stores the acquired numerical values, a calculating part 120, which calculates the compression amount of bumps 22, etc. and the bending amount of substrates 20, etc. from the numerical values stored in the numerical value storing part 110, a junction estimating part 130, which estimates whether or not the respective bumps 22[, etc.] will be joined based on the compression amount, etc. of bumps 22, etc. calculated by the calculating part 120, and a change processing part 140, which performs processing that changes the numerical value in the case in which it has been estimated by the junction estimating part 130 that the bumps 22[, etc.] will not be joined. Here, the calculating part 120 may calculate the compression amount of the bumps 22, etc. and the bending amount of the substrates 20, etc. using the finite element method or may approximately calculate them using material mechanics. Moreover, the design system 10 comprises a pressure estimating part 150, which estimates whether or not the respective bumps 22[, etc.] are joined at a pressure at or above the required pressure, and a strain estimating part 160, which estimates whether or not the pressure received by the functional elements formed on the substrates 20, etc. has reached the maximum allowable pressure.

Here, the design system 10 is measuring equipment such as a PC that has a keyboard as an input apparatus and a display as an output apparatus, and the above functions may also be realized by installing a program that has the functions from the aforementioned numerical value acquiring part 100 through the strain estimating part 160. In that case, the design system 10 may also be installed from a storage medium 12 that has stored said program, and installation may also be performed by acquiring from a network.

Figure 4A:
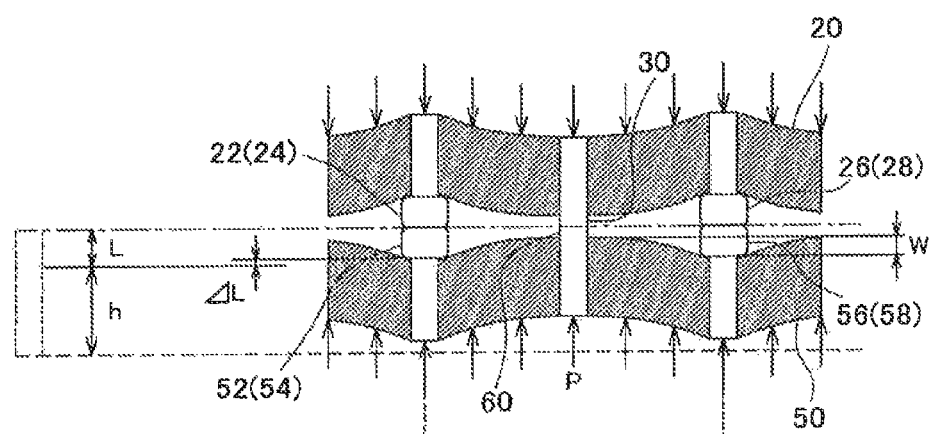
FIGS. 4(a) and 4(b) are schematic drawings for describing a plurality of calculation parameters.
Figure 4B:
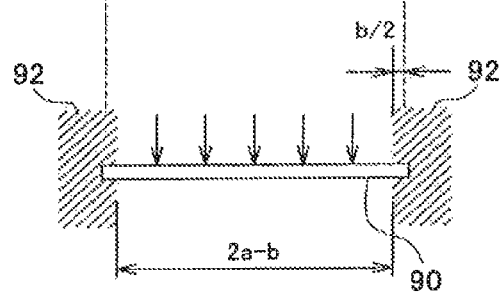

FIG. 4 is a schematic drawing that describes a plurality of calculation parameters used in the design system 10. FIG. 4(a) shows a status in which bump 30 and bump 60 have come into contact regardless of the variation C in the heights of FIG. 2(a) in the case in which substrate 20 and substrate 50 have been pressed at a pressure P. FIG. 4(b) shows a model of the case in which the calculating part 120 has performed an approximate calculation using material mechanics with FIG. 2(b) as the unit area.

In the model of FIG. 4(b), the bending amount of substrate 20 is calculated as a bending problem of the material mechanics in which an equally distributed load has been applied to a square plate 90 in which the peripheral 4 sides have been fixed to a fixing part 92 and whose length of one side is (2a-b). In addition, in the model of FIG. 4(b), when center bumps 30 and 60 of the unit area are assumed to be lower than peripheral bumps 22, etc. by the same amount as the variation C, and the conditions for said bump 30 and bump 60 to be joined have been satisfied, it is considered that the respective opposing substrates 20, etc. in substrates 20 and 50 will be joined. Note that, in manufacturing a semiconductor device, substrate 20 has a thickness of, for example, 725 μm, and after this has been joined to the substrate that is the base, substrate 20 is thinned to 50 μm, a substrate 50 that has a thickness of 725 μm is joined onto the thinned substrate 20, and said substrate 50 is further thinned to 50 μm, but in said model a vertically symmetrical shape is assumed in order to simplify the calculation.

Bending of substrates 20 and 50 shown in FIG. 4 markedly occurs due to pressing said substrates 20, 50 using a membrane or fluid, etc. In addition, in the case in which substrates 20 and 50 are held by holding members such as ones that are ceramic to press said holding members, if the holding members are thin enough, said bending is produced. In addition, it is also conceivable that, in the case in which there is slight unevenness at the rear surface of the substrate and the surface of the holding member, said unevenness will be crushed when pressure is received to perform cushioned functioning, and substrates 20 and 50 will bend.

Figure 5:
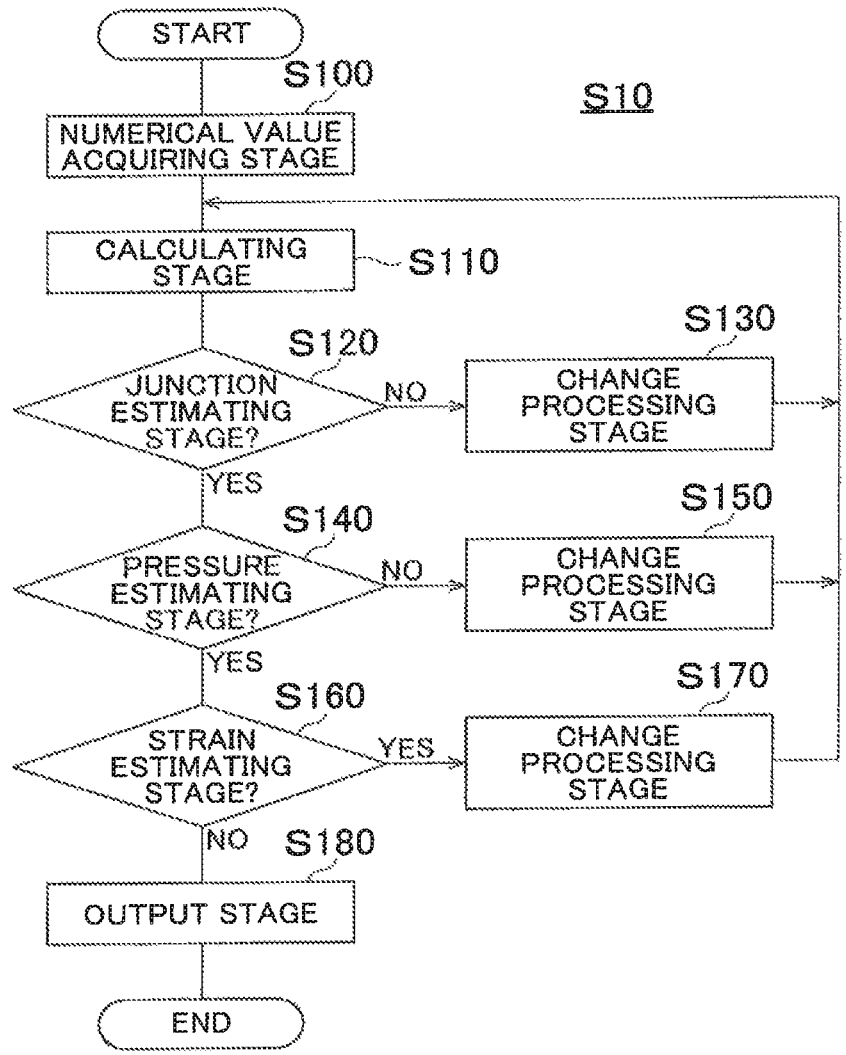
FIG. 5 is a flow chart that shows a processing operation S10 of the design system 10.

FIG. 5 is a flow chart that shows a processing operation S10 of the design system 10. In said processing operation S10, first, the numerical value acquiring part 100 acquires the respective numerical values of a plurality of calculation parameters from the outside and stores them in the numerical value storing part 110 (S100). In this case, the numerical value acquiring part 100 may acquire said numerical values by means of input to a keyboard by a user and may also acquire by reading from another database.

An example of the plurality of calculation parameters that the numerical value acquiring part 100 acquires is shown in Table 1. Here, the numerical value acquiring part 100 acquires the respective numerical values of the shape parameters of substrates 20 and 50, the shape parameters of bumps 22, etc., and the arrangement parameter of bump 22 of substrates 20 and 50 as numerical values of the calculation parameters. Which calculation parameters the numerical value acquiring part 100 is to acquire is dependent upon the system of calculation resulting from the calculating part 120. For example, the calculation parameters shown in Table 1 below are acquired from the outside by the numerical value acquiring part 100 in the case in which the material mechanics model shown in FIG. 4(b) is used.

TABLE 1

| | |
|---|---|
| Young's modulus of substrate | Es |
| Poisson's ratio of substrate | Ns |
| Young's modulus of bump | Eb |
| Poisson's ratio of bump | Nb |
| Substrate thickness | H |
| Pressure applied to substrate | P |
| Bump pitch | A |
| Bump width | B |
| Bump height | L |
| Bump surface ratio | M |
| Pressure applied per bump | Pb |
| Substrate bending coefficient | α |
| Height variation between adjacent bumps | c |

In the aforementioned step S100, the numerical value storing part 110 may also store flags that, from among the stored calculation parameters, discriminate those for which changes in the numerical value are allowed during calculation and those for which they are not in association with said calculation parameters. In this case, the numerical value storing part 110 associates flags for which changes in the numerical value during calculation are not allowed with calculation parameters in which design changes cannot be made or in which changes will be difficult when the material is specified as in physical property values. In Table 1, an example of a calculation parameter for which changes are not allowed is the Young's modulus Es of the substrate. On the other hand, the numerical value storing part 110 associates flags for which changes in the numerical value are allowed during calculation with calculation parameters in which changes are possible, such as the numerical value relating to layout. In Table 1, an example of a calculation parameter for which changes are allowed is the bump pitch a.

Note that whether or not a change is allowable among the calculation parameters may be discriminated according to the presence or absence of an alternative and the relative size of the repercussion effect with respect to the entire process. In this case, for the material of the bump and substrate, there are few alternatives, and there are large repercussion effects with respect to the entirety in terms of process, performance and cost, which will involve large changes to the overall process. On the other hand, the wiring pitch, bump height and overall layout, etc. are parameters for which changes are allowed at the designer level, and the repercussion effect with respect to the entirety is small, so changes may be allowed with priority over the material of the bump and substrate.

Next, the calculating part 120 calculates the compression amount ΔL of said bumps 22, etc. and the bending amount w of substrates 20, etc. when substrates 20 and 50 are pressed at a prescribed pressure P so that the front end faces of bumps 22, etc. formed on substrate 20 and the front end faces of bumps 52, etc. formed on the other substrate 50 come into contact based on the respective numerical values of the calculation parameters stored in the numerical value storing part 110 (S110). For example, the calculating part 120 calculates the compression amount ΔL of the bump and the bending amount w of the substrate using the model shown in FIG. 4(b) by substituting the numerical values stored in the numerical value storing part 110 into Equation 1 and Equation 2 below.

$$\Delta L = 2(Pb \cdot L)/Eb \qquad \text{Equation 1:}$$

$$w = \alpha \cdot P(2a-b)^4/(Es \times h^3) \qquad \text{Equation 2:}$$

Note that, in Equation 1 above, the reason that the coefficient 2 is applied is that the fact that, until the low bumps 30, 60 come into contact, the other four bumps 22, 24, 26, 28 within the unit area are each ¼, that is, a pressure Pb is essentially received by one bump, is taken into account. In addition, in Equation 2, the (−b) term is due to the fact that the effective length of the plate 90 is shortened due to the existence of bumps 22, etc. by a commensurate amount is taken into account.

After the aforementioned step S110, the junction estimating part 130 estimates whether or not the opposing bumps 30, 60, etc. will be joined (S120). In this case, the junction estimating part 130 estimates that the opposing bumps 30, 60 will be joined in the case in which a total of the compression amount & and the bending amount w calculated by the calculating part 120 is larger than a prescribed value (S120: Yes) and estimates that the opposing bumps 30, 60 will not be joined in the case in which this is smaller than a prescribed value (S120: No).

Here, an example of a prescribed value is the flatness of the front end faces of bumps 22, etc. prior to substrates 20 and 50 being pressed. An example of said flatness may be the height variation C between adjacent bumps that is stored in the numerical value storing part 110 or a value resulting from adding a margin portion to this variation C. In this case, in the model shown in FIG. 4(b), the junction estimating part 130 estimates the presence or absence of a junction of bump 30 and bump 60 by comparing the total of the compression amount ΔL and the bending amount w calculated according to the above Equation 3 and Equation 4 with the above prescribed value.

In the aforementioned step S120, in the case in which it has been estimated that any of the opposing bumps will not be joined (S120: No), the change processing part 140 changes the numerical value of at least one calculation parameter among the plurality of calculation parameters and stores them in the numerical value storing part 110 (S130). Next, the operations from steps S110 through S130 are repeated until it has been estimated that opposing bumps 30 and 60 will be joined (S120: Yes).

In step S130, a priority sequence may be set with respect to which calculation parameter is to be changed. In this case, the change processing part 140 changes the numerical value of the calculation parameter with the highest priority sequence within a prescribed range, the calculating part 120 performs a calculation based on the changed numerical value, and the junction estimating part 130 estimates whether or not bumps 30 and 60 have come into contact. In the case in which it has been estimated by the junction estimating part 130 that the front end face of bump 30 and the front end face of bump 60 will come into contact regardless of whether or not said calculation parameter has been changed within the prescribed range, the change processing part 140 sets the optimal numerical value within said range with respect to said calculation parameter to change the numerical value of the next priority sequence calculation parameter and continue calculation processing.

For example, the change processing part 140 changes the numerical value of the bump pitch a among the calculation parameters to a large value, changes the numerical value of the bump width b to a small value, and changes the numerical value of the pressure P applied to the substrate to a large value. In addition, the change processing part 140 sets in advance the range in which the numerical value of the aforementioned calculation parameter is to be changed, and, in the aforementioned range, in the case in which it has been estimated that the opposing bumps 30, 60 will be joined, further changes the numerical value of the substrate thickness h to a small value, changes the value of the bump height L to a large value, and changes the numerical value of the height variation C to a small value. Here, in the case in which the numerical value storing part 110 stores a flag that discriminates between those for which changes in the numerical value are allowed during calculation and those for which they are not, the change processing part 140 may refer to the numerical value storing part 110, change the numerical value of the calculation parameter associated with the flag for which changes are allowed and store it in the numerical value storing part 110.

Note that the priority order may be made higher for calculation parameters that have little effect on cost, process and performance. In addition, it is preferable that the effects ratio in the case in which one calculation parameter has been changed be calculated. For example, when the bump pitch has been widened, it is preferable that calculation and presentation be performed with respect to what type of effect there will be respectively upon yield, performance and cost.

In the aforementioned step 120, in the case in which it has been estimated that the opposing bumps 30, 60 will be joined (S120: Yes), the pressure estimating part 150 estimates whether or not bumps 30, etc. are respectively joined at or above the required pressure (S140). For example, the pressure estimating part 150 determines that bumps 30, etc. are respectively joined at a pressure at or above the required pressure in the case in which the value of the pressure Pb applied per bump is greater than a threshold value that has been determined in advance. In this case, the pressure estimating part 150 may estimate that the respective bumps 22, etc. are joined at a pressure at or above the required pressure in the case in which the peeling force of the bumps to which the minimum pressing force of the pressing force Pb per bump is applied is smaller than said minimum pressing force. Here, the peeling force is a force that acts from substrates 20 and 50 to bumps 30 and 60 and refers to a force that mutually separates bumps 30 and 60 by means of a restoring force that attempts to cause substrates 20 and 50 to return to their original shapes when bending deformation has taken place.

In the aforementioned step S140, in the case in which it has been estimated that any of bumps 30, etc. are not joined at a pressure at or above the required pressure (S140: No), the change processing part 140 performs processing so as to change the numerical value of the calculation parameter (S150). Next, the operations from step S110 through S150 are repeated until it has been estimated that bumps 30, etc. are respectively joined at a pressure at or above the required pressure (S140: Yes).

For example, the change processing part 140 changes the numerical value of the pressure P so that the pressure P applied to the substrate is increased. In addition, the change processing part 140 sets in advance the range by which the numerical value of the aforementioned calculation parameter is to be changed, and, in the aforementioned range, in the case in which it has been estimated that opposing bumps 30 and 60 will be joined, among the calculation parameters, may further change the numerical value of bump pitch a to a large value, change the value of the bump width b to a small value, change the numerical value of the substrate thickness h to a small value, change the numerical value of the bump height L to a large value, and change the value of the height variation C to a small value. Here, the fact that the flag of the numerical value storing part 110 may also be referred to, the fact that an optimal numerical value within a prescribed range may also be set, and the fact that a priority sequence may be applied to the calculation parameters are the same as in step S130.

In the aforementioned step S140, in the case in which it has been estimated that bumps 30 and 60 will be joined at a pressure at or above the required pressure (S140: Yes), the strain estimating part 160 estimates whether or not the pressure received by the functional elements formed on substrates 20 and 50 in the vicinity of bumps 30, etc. has reached the maximum allowable pressure (S160). The pressure that the functional elements receive may also be calculated by the finite element method, and, in the case in which the model of FIG. 4(*b*) is used, may also be approximated using the pressure applied per [bump] Pb of bumps 22, etc.

In the aforementioned step S160, in the case in which it has been estimated that the pressure that the functional elements receive has reached a maximum allowable pressure (S160: Yes), the change processing part 140 performs processing so as to change the numerical values of the calculation parameters (S170). Next, the operations from steps S110 through S170 are repeated until the pressure that the functional elements receive does not reach the maximum allowable pressure (S160: No).

For example, the change processing part 140, among the calculation parameters, changes the numerical value of the pressure P applied to the substrate to a small value, changes the numerical value of the bump pitch a to a large value, and changes the numerical value of the bump width b to a small value. In addition, the change processing part 140 may further change, among the calculation parameters, the numerical value of the substrate thickness h to a large value in the case in which the range in which the numerical values of the aforementioned calculation parameters are to be changed is set in advance, and, in the aforementioned range, it has not been estimated that the pressure that the functional elements receive has not reached the maximum allowable pressure. Here, the fact that the flag of the numerical value storing part 110 may be referred to, the fact that an optimal numerical value may be set within the prescribed range, and the fact that a priority sequence may be applied to the calculation parameters are the same as in step S130.

In the aforementioned step S160, in the case in which it has been estimated that the pressure that the functional elements receive has not reached the maximum allowable pressure (S160: No), the change processing part 140 may output the respective numerical values of the calculation parameters, that is, the respective numerical values stored in the numerical value storing part 110 (S180), and the operation resulting from said flow chart ends. In this case, the change processing part 140 may also display the respective numerical values on a display and may handover data to another design tool.

Note that, in the aforementioned steps S130, S150 and S170, the change processing part 140, instead of automatically changing the numerical values of the calculation parameters, may, for example, give a warning on the display to the effect that said calculation parameters should be changed and wait for input of new numerical values from the user. In this case, the change processing part 140 may also display the optimal numerical values of said calculation parameters on the display. In addition, in this case, when the user has input new numerical values, if those numerical values are not optimal numerical values for the joining of the respective bumps 22, [etc.,] it is possible to render input of those numerical values impossible.

Figure 6:
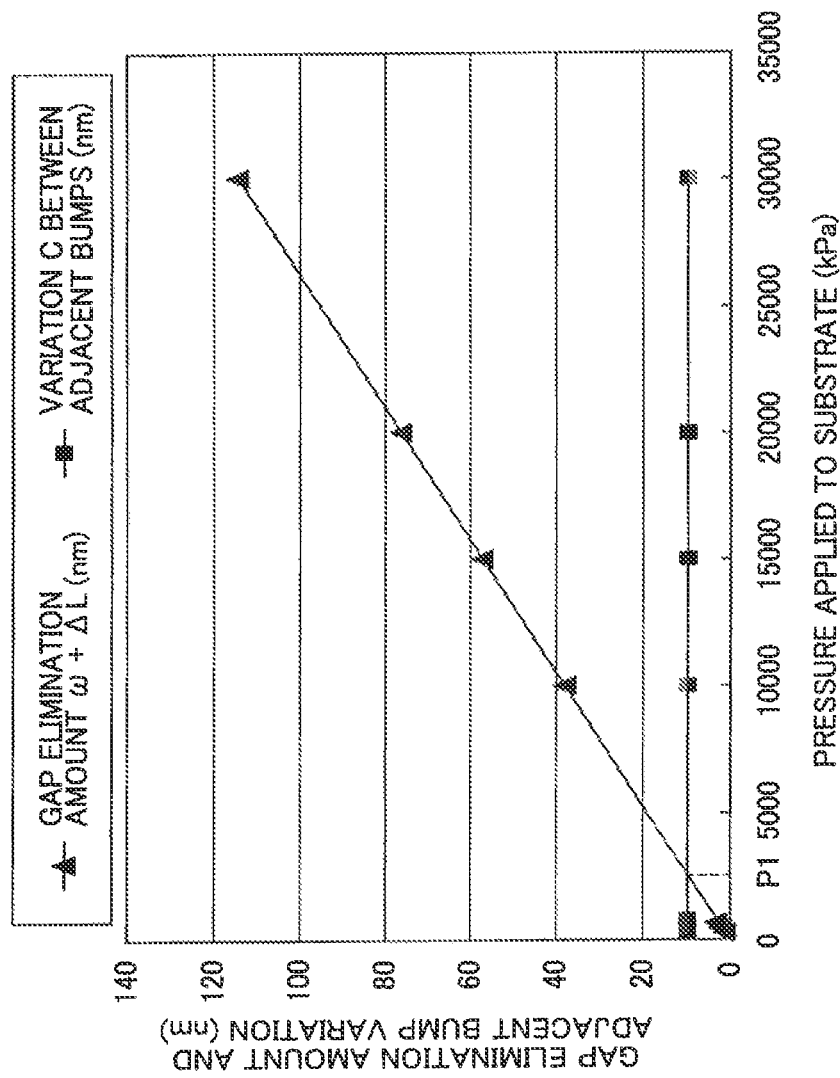
FIG. 6 is an example of calculation results resulting from the design system 10.

FIG. 6 is an example of a calculation result resulting from the design system 10. FIG. 6 shows the results of the change processing part 140 having changed the numerical value of the pressure P applied to the substrate and, based on the changed numerical value, the numerical value storing part 110 having calculated the gap elimination amount, that is, the total of the compression amount ΔL of said bumps 22, etc. and the bending amount w of substrates 20, etc., and the height variation C between adjacent bumps.

As is clear from FIG. 6, in the case in which the pressure P has been changed, and the other calculation parameters have been fixed, at or above a certain pressure P1, the gap elimination amount w+ΔL exceeds the variation C. Therefore, in said design, by making the pressure P at which substrate 20 and substrate 50 are pressed the aforementioned pressure P1 or higher, it is possible to cause bumps 22, etc. of substrate 20 and bumps 52, etc. of substrate 50 to come into contact.

Figure 7A:
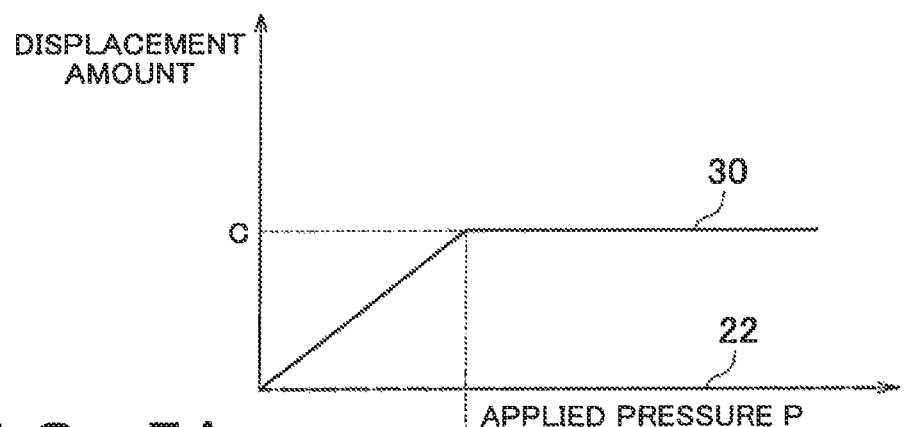
FIGS. 7(a) and 7(b) are examples of calculation results resulting from the design system 10.
Figure 7B:
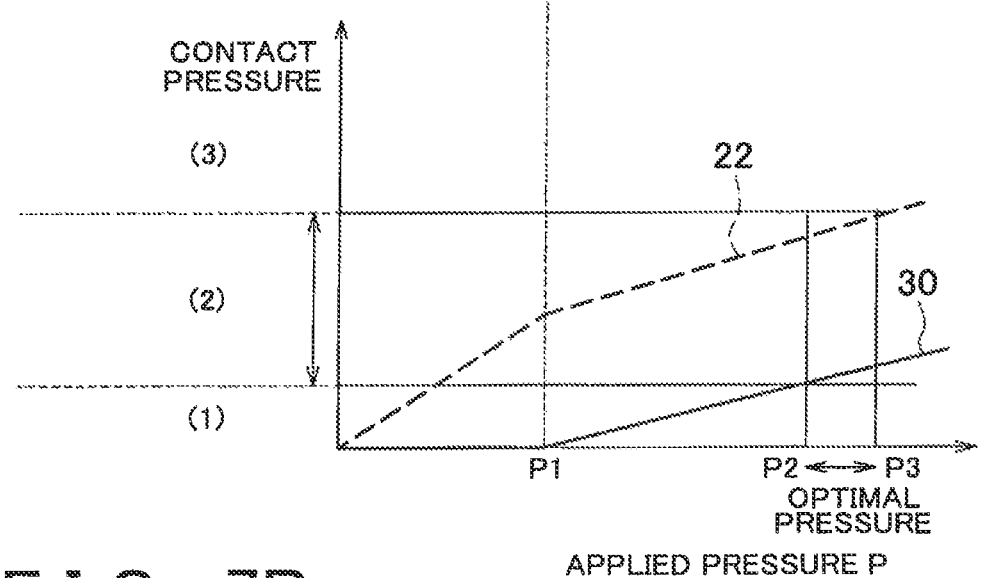

FIG. 7 is an example that shows the results of the bumps 30, etc. having respectively been joined at a pressure at or above the required pressure by means of the design system 10 and the range at which the pressure that the functional elements receive does not reach the maximum allowable pressure having been calculated. FIG. 7(a) is such that the amounts of displacement of the front end face of bump 22 and the front end face of bump 30 with respect to the pressure P that presses substrate 20 are shown by the broken line and the solid line. In addition, FIG. 7(b) shows the pressure at which bump 22 and bump 52 come into contact and the pressure at which bump 30 and 60 come into contact with respect to the pressure P that presses substrate 20.

As shown in FIG. 7(a), bump 22 and bump 52 are in contact from the beginning, so even if pressure P is further applied, the front end face of bump 22 is not displaced. In contrast with this, the front end face of bump 30 is separated from bump 60 in a status in which pressure P is not applied, and, when pressure P is applied, substrate 20 bends and is displaced so as to approach bump 60. When pressure P is further applied, the front end face of bump 30 comes into contact with the front end face of bump 60 at pressure PI of FIG. 6, and, even if greater pressure is applied, the front end face of bump 30 is not displaced.

In addition, as shown in FIG. 7(b), in region (1) at the contact pressure, the contact pressure of the front end face of bump 30 and the front end face of bump 60 is at or below the aforementioned required pressure. In addition, in region (2), the contact pressure of the front end face of bump 30 and the front end face of bump 60 is at or above the aforementioned required pressure, and the pressure that the functional elements receive does not reach the maximum allowable pressure. In addition, in region (3), the contact pressure of the front end face of bump 30 and the front end face of bump 60 is at or above the aforementioned required pressure, but the pressure that the functional elements receive reaches or exceeds the maximum allowable pressure. Therefore, applied pressures P2 and P3 that correspond to the range of region (2) are the optimal pressures. According to the aforementioned design system 10, pressure P I can be determined by the estimation of step S120, pressure P2 can be determined by the estimation of step S140, and pressure P3 can be determined by the estimation of step S160.

Figure 8:
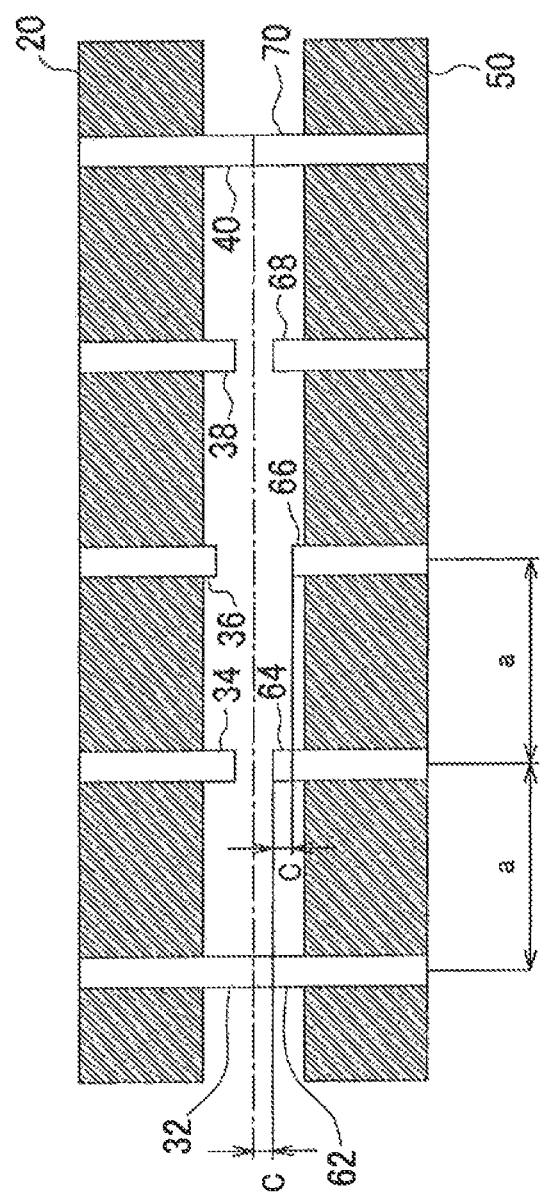
FIG. 8 is a schematic drawing that shows another example of substrates 20.

FIG. 8 is a schematic view that shows other examples of substrates 20 and 50. In FIG. 8, the heights of bumps 34 and 38 adjacent to bumps 32 and 40 of substrate 20 are lower than the heights of bumps 32 and 40 by the variation C portion, and, furthermore, the height of bump 36 adjacent to said bumps 34 and 38 is lower than the heights of bumps 34 and 38 by the variation C portion. The relationship of the heights is the same for bumps 62, 64, 66, 68 and 70 of substrate 50 as well.

With respect to substrates 20 and 50 shown in FIG. 8 as well, by means of, for example, the finite element method, it is possible for the design system 10 to perform the calculations from step S120 through S170 and to output numerical values in step S180. In addition, instead of the finite element method, it is also possible to use a model similar to that shown in FIG. 4(b). In this case, first, until the junction estimating part 130 estimates that the gap elimination amount w+ΔL will exceed variation C in the model in which the bump pitch has been set to 2a in FIG. 4(b), the change processing part 140 changes the calculation parameters, and the calculating part 120 calculates said gap elimination amount w+ΔL. Next, when it has been estimated that the gap elimination amount w+ΔL will exceed variation C, it is estimated that bumps 34 and 64 have come into contact, and the change processing part 140 changes the bump pitch among said calculation parameters to a, and, based on this, the calculating part 120 calculates the gap elimination amount w+ΔL, and the junction estimating part 130 estimates whether or not variation C will be exceeded. Through this, a model similar to that of FIG. 4(b) can be used to perform calculations for substrates 20 and 50 of FIG. 8 as well.

Figure 9:
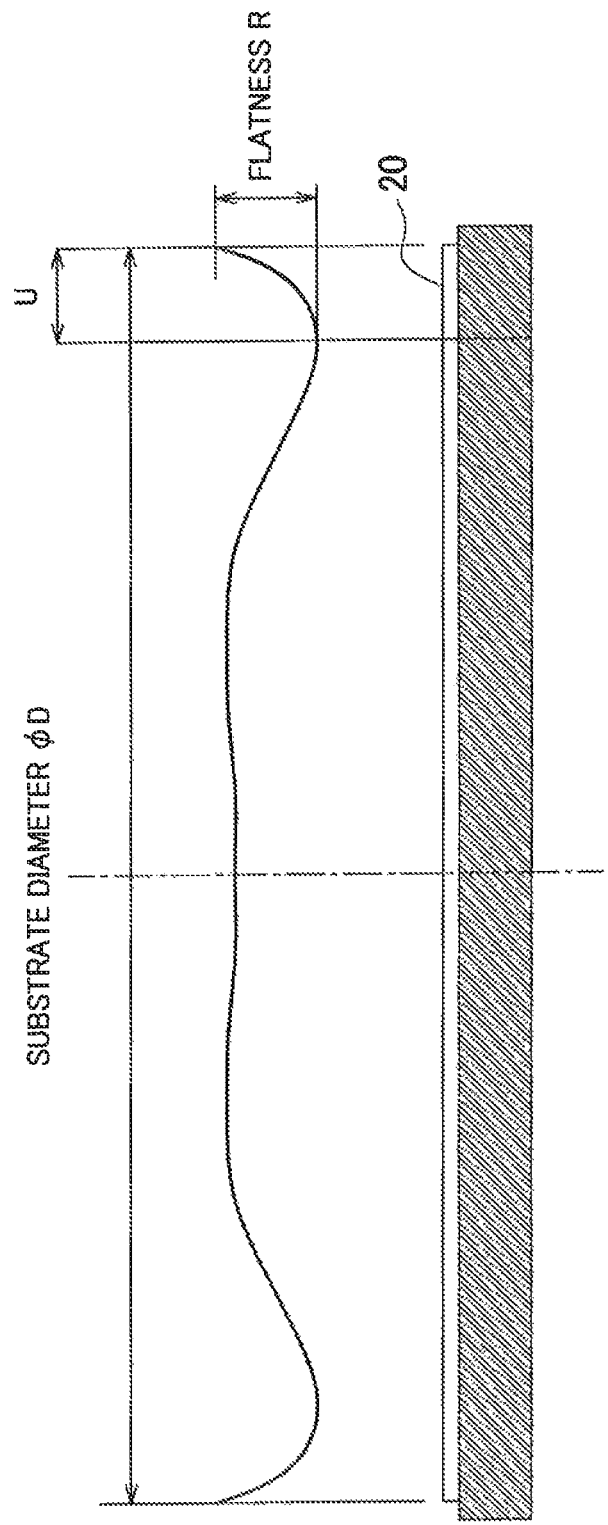
FIG. 9 is a schematic drawing that describes an example of a method of approximating the variation C of the heights of the bumps 22, etc.

FIG. 9 is a schematic view that describes an example of a method of approximating the height variation C of bumps 22, etc. Accurately measuring the difference in heights between adjacent bumps is difficult. Therefore, the height variation C may be approximated using a so-called global value of the entire substrate. For example, the flatness R of the overall substrate, the 114 length U of the swell minimum wavelength and the bump pitch a may be used, and R×(a/U) may be used as the value of variation C. In this case, the flatness R of the overall substrate and the ¼ length U of the swell minimum wavelength may also be considered calculation parameters.

In the above, according to the present embodiment, in the design stage of said semiconductor apparatus in the case in which substrates 20 and 50 are to be joined to manufacture a semiconductor device, the numerical values of the respective calculation parameters can be determined so that the front end faces of opposing bumps 30 and 60 of substrates 20 and 50 come into contact. In addition, in the above design, the numerical values of the respective calculation parameters are determined so that bumps 30, etc. are respectively joined at a pressure at or above the required pressure, so it is possible to determine the numerical values of the respective calculation parameters so that the front end faces of bumps 30 and 60 are more reliably electrically connected. Furthermore, in the aforementioned design, the numerical values of the respective calculation parameters are determined so that the pressure that the functional elements receive does not reach the maximum allowable pressure, so it is possible to determine the numerical values of the respective calculation parameters so as to restrict fluctuation of the properties of the functional elements. Therefore, according to the present embodiment, it is possible to judge junction defects of a semiconductor device that has been three-dimensionally laminated in the circuit design stage in order to avoid this. In addition, if there are problems in terms of stress even though joining is possible, it is possible to perform design that avoids said stress problems. Through this, it is possible to design a three-dimensionally laminated semiconductor with no junction defects or functional element abnormalities.

Figure 10:
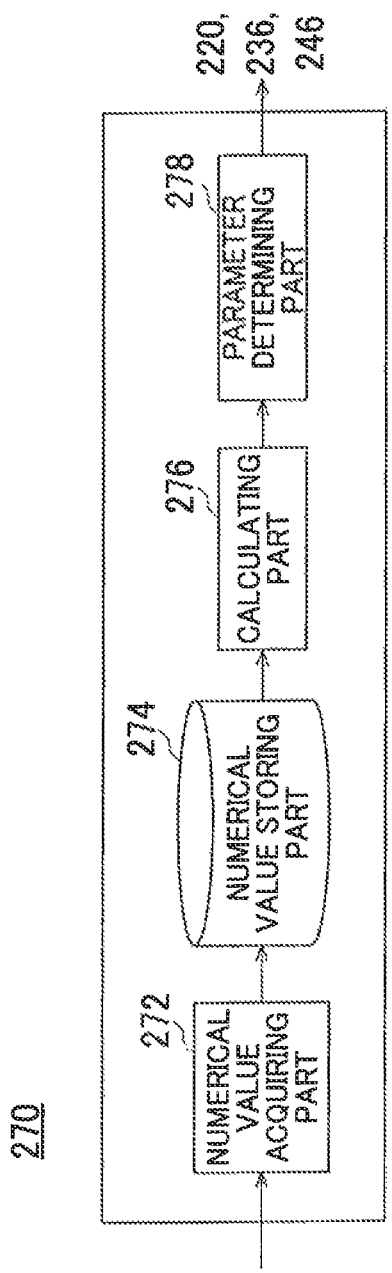
FIG. 10 shows a functional block of a control part 270 of another embodiment.

FIG. 10 shows a functional block of a control part 270 of another embodiment. The control part 270 controls the process parameters of the substrate bonding apparatus 200. The control part 270 comprises a numerical value acquiring part 272, which acquires the numerical values of the calculation parameters, a numerical value storing part 274, which stores the acquired numerical values, a calculating part 276, which calculates the bumps 22, etc. compression amount and the substrates 20, etc. bending amount from the numerical values stored in the numerical value storing part 274, and a parameter determining part 278, which determines the process parameter values so that the total of the compression amount and the bending amount calculated by the calculating part 276 becomes larger than a prescribed value.

The numerical value acquiring part 272, similarly to the numerical value acquiring part 100 of the design system 10 described in FIG. 2, acquires the numerical values of the calculation parameters and stores them in the numerical value storing part 274. The configuration and operation of the numerical value storing part 274 are similar to those of the numerical value storing part 110 of the design system 10, so a description will be omitted. Examples of the calculation parameters are shown in Table 1, and they particularly are parameters that cannot be changed or are difficult to change in processes, for example, the Young's modulus Es of the substrate.

The calculating part 276, in the substrate bonding apparatus 200, calculates the bumps 22, etc. compression amount and substrates 20, 50 compression amount when substrates 20 and 50 are pressed so that the front end faces of bumps 22, etc. of substrate 20 come into contact with the front end faces of bumps 52, etc. of substrate 50 based on the respective numerical values of the calculation parameters stored in the numerical value storing part 274. In this case, the calculating part 276, similarly to the calculating part 120, may also perform calculations using the finite element method or the material mechanics model.

The parameter determining part 278 determines the process parameter values so that the total of the compression amount and the bending amount calculated by the calculating part 276 becomes larger than a prescribed value. In this case, the parameter determining part 278 determines the parameters that can be controlled in the substrate bonding apparatus 200, for example, the pressure P applied to the substrate, as process parameters. Calculation by the numerical value acquiring part 272 and the method of determining by the parameter determining part 278 are similar to the operation flow chart of the design system 10, so a description will be omitted. In addition, the parameter determining part 278 may also determine the temperatures of heaters 236 and 246 as other examples of process parameters in the case in which there has been association of the temperature with other calculation parameters. For example, the Young's modulus Es has temperature dependency in which it becomes lower the higher the temperature. Therefore, by treating the Young's modulus Es as a function of the temperature and determining the temperatures of heaters 236 and 246 as process parameters, the Young's modulus Es can also be indirectly changed.

In addition, the parameter determining part 278 controls the pressing part 220 so that substrate 20, which is held by the second substrate holding part 242, and substrate 50, which is held by the first substrate holding part 234, press at the determined process parameter value. Through this, in the substrate bonding apparatus 200, the front end faces of bumps 22, etc. of substrate 20 and the front end faces of bumps 52, etc. of substrate 50 come into contact.

In the above, according to the present embodiment, in the substrate bonding apparatus 200, it is possible to reliably bring the front end faces of bumps 22, etc. of substrate 20 and the front end faces of bumps 52, etc. of substrate 50 into contact. Therefore, in a three-dimensionally laminated semiconductor device, it is possible to more reliably restrict junction defects in the vertical directions.

In the present embodiment, an example in which, among the calculation parameters acquired by the numerical value acquiring part 100, the numerical values of the bump pitch a, the bump width b, the pressure P, the substrate thickness h, the bump height L and the height variation C were respectively changed by the change processing part 140 was shown, but, instead of this, or in addition to this, it is possible to change other calculation parameters by means of the change processing part 140.

In addition, in the present embodiment, an example in which, among a plurality of calculation parameters, changes in the bump pitch a, the bump width b, the pressure P, the substrate thickness h, the bump height L and the height variation C were allowed was shown, but, instead of this, it is possible to fix calculation parameters other than, for example, the arrangement gaps of bumps 22, etc. to the respective substrates 20, 50, that is, the bump pitch a, and to allow changes only in the bump pitch a period In this case, it is possible to store calculation parameters other than the bump pitch a in advance in the numerical value storing part 110 and to cause only the value of the bump pitch a, which is a variable parameter, to be acquired by the numerical value acquiring part 100.

In addition, in this case, it is possible for the junction estimating part 130 to estimate that the respective mutually corresponding bumps 22, etc. will be mutually joined in the case in which the value of the bump pitch a is larger than a prescribed value. At this time, it becomes easier for the respective substrates 20, 50 to bend due to the pressure P as the value of the bump pitch a becomes larger. Therefore, the value of the bump pitch a when the values of the bending amounts w of the respective substrates 20, 50 have become values when joining of the respective mutually corresponding bumps 22, etc. becomes possible becomes the prescribed value.

Furthermore, instead of the present embodiment, it is possible to fix calculation parameters other than the width dimensions of the respective bumps 22, etc., that is, the bump width b, and allow changes in only the bump width b.

In this case, calculation parameters other than the bump width b are stored in advance in the numerical value storing part 110, and it is possible to cause only the value of the bump width b, which is a variable parameter, to be acquired by the numerical value acquiring part 100.

In addition, in this case, if the values of the bump widths b of the respective bumps 22, etc. are smaller than a prescribed value, it is possible for the junction estimating part 130 to estimate that the respective mutually corresponding bumps 22, etc. will be mutually joined. At this time, the respective bumps 22, etc. respectively tend to compress due to the pressure Pb as the value of the bump width b becomes smaller. Therefore, the value of the bump width b when the values of the compression amounts $\Delta L$ of the respective bumps 22, etc. have become values when joining of the respective mutually corresponding bumps 22, etc. becomes possible becomes the prescribed value.

In addition, instead of the present embodiment, it is possible to fix calculation parameters other than the height differences of the respective bumps 22, etc. from the respective substrates 20, 50, that is, the variation C, and allow changes in only the variation C.

In this case, calculation parameters other than the variation C are stored in advance in the numerical value storing part 110, and it is possible to cause only the value of the variation C, which is a variable parameter, to be acquired by the numerical value acquiring part 100.

In addition, in this case, if the values of the bump widths b of the respective bumps 22, etc. are smaller than a prescribed value, it is possible for the junction estimating part 130 to estimate that the respective mutually corresponding bumps 22, etc. will be mutually joined. At this time, as the value of the variation C becomes smaller, joining of the respective mutually corresponding bumps 22, etc. becomes easy due to the bending of the respective substrates 20, 50 and the compression of the respective bumps 22, etc. Therefore, when the respective substrates 20, 50 have been bent by a fixed bending amount w, and the respective bumps 22, etc. have been compressed by a fixed compression amount $\Delta L$, the range in which the front end faces of the respective mutually corresponding bumps 22, etc. are mutually able to come into contact becomes the prescribed range. In this case, if the heights of the plurality of bumps 22, etc. respectively differ, it is possible to obtain the difference in heights with respect to other bumps with any height as a reference.

Furthermore, instead of the present embodiment, it is possible to fix calculation parameters other than the bump pitch a and the variation C and allow changes in only the bump pitch a and the variation C.

In this case, calculation parameters other than the bump pitch a and the variation C are stored in advance in the numerical value storing part 110, and it is possible to cause only the values of the bump pitch a and the variation C, which are variable parameters, to be acquired by the numerical value acquiring part 100.

In addition, in this case, if the value of the variation C is within a prescribed range set according to the value of the bump pitch a, it is possible for the junction estimating part 130 to estimate that the respective mutually corresponding bumps 22, etc. will be mutually joined.

For example, by storing the relationship between the value of the bump pitch a and the value of the sum of the bending amounts w of the respective substrates 20, 50 and the compression amounts $\Delta L$ of the respective bumps 22, etc. in advance in the numerical value storing part 110, obtaining the value of that sum from the input value of the bump pitch a, and comparing the input value of the variation C and the value of the sum, it is possible to estimate whether the respective bumps 22, etc. will be mutually joined at the input values of the bump pitch a and the variation C. In the case in which non-junction has been estimated by the junction estimating part 130, a warning may be given or processing may be performed by the change processing part 140 so as to change, for example, the value of the variation C.

In addition, instead of the present embodiment, it is possible to fix calculation parameters other than the bump pitch a and the bump width b and allow changes in only the bump pitch a and the bump width b.

In this case, calculation parameters other than the bump pitch a and the bump width b are stored in advance in the numerical value storing part 110, and it is possible to cause only the values of the bump pitch a and the bump width b, which are variable parameters, to be acquired by the numerical value acquiring part 100.

In addition, in this case, if the value of the bump width b is within a prescribed range set according to the value of the bump pitch a, it is possible for the junction estimating part 130 to estimate that the respective mutually corresponding bumps 22, etc. will be mutually joined.

The case in which non-junction has been estimated by the junction estimating part 130 is such that a warning may be given or processing may be performed by the change processing part 140 so as to change, for example, the value of the bump width b.

Furthermore, instead of the present embodiment, it is possible to fix calculation parameters other than the bump width b and the variation C and allow changes in only the bump width b and the variation C.

In this case, calculation parameters other than the bump width b and the variation C are stored in advance in the numerical value storing part 110, and it is possible to cause only the values of the bump width b and the variation C, which are variable parameters, to be acquired by the numerical value acquiring part 100.

In addition, in this case, if the value of the variation C is within a prescribed range set according to the value of the bump pitch a, it is possible for the junction estimating part 130 to estimate that the respective mutually corresponding bumps 22, etc. will be mutually joined.

The case in which non-junction has been estimated by the junction estimating part 130 is such that a warning may be given or processing may be performed by the change processing part 140 so as to change, for example, the value of the bump width b.

In addition, in the present embodiment, an example in which the respective substrates 20, 50 are respectively comprised by wafers was shown, but, instead of this, it is possible to respectively comprise the respective substrates 20, 50 by semiconductor chips formed by cutting the wafers. In addition, an example in which the respective substrates 20, 50 were comprised by a single wafer was shown, but, instead of this, it is possible to comprise the respective substrates 20, 50 by laminated bodies in which a plurality of the wafers or a plurality of the chips has already been laminated.

Note that the height variation C of bumps 22, etc. may be also verified by actually measuring the heights of bumps 22, etc. provided on substrates 20 and 50. In this case, the individual heights of bumps 22, etc. may be measured by means of a confocal microscope to calculate these variations C. In addition, the peeling force used in order for the pressure estimating part 150 to estimate the pressure may be obtained from substrates 20 and 50 after joining. In this case, junction defect bumps may also be estimated by measuring the irregularity of the rear surfaces of substrates 20 and 50 after joining.

In addition, the present invention was described using embodiments, but the technical scope of the present invention is not limited to the range described in the above embodiments. It is clear to persons skilled in the art that various modifications and improvements may be added to the above embodiments. The fact that modes to which those various changes and improvements have been added can also be included within the technical scope of the present invention is clear from the descriptions of the claims.

It must be kept in mind that the execution sequences of the respective processes such as those of the operations, procedures, steps and stages in apparatuses, systems, programs and methods indicated in the scope of patent claims, specification and drawings are such that "prior to," "in advance," etc. are not especially clearly stated and can be realized by any sequences as long as the output of previous processing is not used in subsequent processing. With regard to the operation flow in the scope of patent claims, specifications and drawings, even though, for convenience, descriptions were given using "first," "next," etc., this does that mean that implementation must be in this order.

What is claimed is:

1. A method comprising:
   acquiring, by a numerical value acquiring part, a numerical value of at least one calculation parameter affecting a possibility of joining a first substrate and a second substrate; and
   warning or changing, by a change processing part, the numerical value of the at least one calculation parameter when at least one of a non-junction and a strain is affirmative, based on the numerical value of the at least one calculation parameter, the non-junction being affirmative when a first terminal of the first substrate will not be in contact with a second terminal of the second substrate which corresponds to the first contact when pressure is applied to the first and second substrates in a stacked state, the strain being affirmative when a pressure that a functional element formed on one of the first and second substrates will receive will exceed a maximum allowable pressure when pressure is applied to the first and second substrates in a stacked state.

2. The method of claim 1, further comprising estimating, by an estimating part, at least one of the non-junction and the strain.

3. The method of claim 2, wherein estimating the non-junction includes calculating a compression amount of the first and second terminals and a bending amount of the first and second substrates, wherein the non-junction is affirmative when the total of the compression amount and the bending amount is not larger than a flatness of the first and second terminals.

4. The method of claim 1, further comprising displaying the numerical value of the at least one calculation parameter.

5. The method of claim 1, wherein the changing includes setting the optimal numerical value of the calculation parameter.

6. The method of claim 1, further comprising associating, in a numerical value storing part, a first flag with at least one calculation parameter which is allowed to be changed, and a second flag with at least one calculation parameter which is not allowed to be changed.

7. The method of claim 1, wherein the changing includes changing the numerical value of at least one calculation parameter having the highest priority.

8. A non-transitory computer-readable medium having computer-readable instructions stored thereon that, when executed by at least one processor, cause the at least one processor to perform operations comprising:
   acquiring, by a numerical value acquiring part, a numerical value of at least one calculation parameter affecting a possibility of joining a first substrate and a second substrate;
   giving a warning or changing, by a change processing part, the numerical value of the at least one calculation parameter when at least one of a non-junction and a strain is affirmative, based on the numerical value of the at least one calculation parameter, the non-junction being affirmative when a first terminal of the first substrate will not be in contact with a second terminal of the second substrate which corresponds to the first contact when pressure is applied to the first and second substrates in a stacked state, the strain being affirmative when a pressure that a functional element formed on one of the first and second substrates will receive will exceed a maximum allowable pressure when pressure is applied to the first and second substrates in a stacked state.

9. The non-transitory computer-readable medium of claim 8, further comprising a further instruction that, when executed by the at least one processor, causes the processor to perform a further operation of estimating at least one of the non-junction and the strain.

10. The non-transitory computer-readable medium of claim 8, wherein estimating the non-junction includes the at least one processor performing a further operation of Calculating a compression amount of the first and second terminals and a bending amount of the first and second substrates, wherein the non-junction is affirmative when the total of the compression amount and the bending amount is not larger than a flatness of the first and second terminals.

11. The non-transitory computer-readable medium of claim 8, further comprising a further instruction that, when executed by the at least one processor, causes the processor to perform a further operation of displaying the numerical value of the at least one calculation parameter.

12. The non-transitory computer-readable medium of claim 8, wherein the changing includes a further instruction that, when executed by the at least one processor, causes the processor to perform a further operation of setting the optimal numerical value of the calculation parameter.

13. The non-transitory computer-readable medium of claim 8, further comprising a further instruction that, when executed by the at least one processor, causes the processor to perform a further operation of associating, in a numerical value storing part, a first flag with at least one calculation parameter which is allowed to be changed and a second flag with at least one calculation parameter which is not allowed to be changed.

14. The non-transitory computer-readable medium of claim 8, wherein the changing includes a further instruction that, when executed by the at least one processor, causes the processor to perform a further operation of changing the numerical value of the at least one calculation parameter having the highest priority.

15. An apparatus comprising:
   a first substrate holding part that holds a first substrate, the first substrate including a plurality of terminals;
   a second substrate holding part that holds a second substrate, the second substrate holding a plurality of terminals;
   a numerical value acquiring part that acquires a numerical value of at least one calculation parameter affecting a possibility of joining a first substrate and a second substrate; and
   a change processing part that gives a warning or changes the numerical value of the at least one calculation parameter when at least one of a non-junction and a strain is affirmative, based on the numerical value of the at least one calculation parameter, the non-junction being affirmative when a first terminal of the first substrate will not be in contact with a second terminal of the second substrate which corresponds to the first contact when pressure is applied to the first and second substrates in a stacked state, the strain being affirmative when a pressure that a functional element formed on one of the first and second substrates will receive will exceed a maximum allowable pressure when pressure is applied to the first and second substrates in a stacked state.

16. The apparatus of claim 15, further comprising an estimating part that estimates the at least one of a non-junction and a strain when pressure is applied to the first and second substrates.

17. The apparatus of claim 16, wherein the estimating part calculates a compression amount of the first and second terminals and a bending amount of the first and second substrates, wherein the non-junction is affirmative when the total of the compression amount and the bending amount is not larger than a flatness of the first and second terminals.

18. The apparatus of claim 15, wherein one of the at least one calculation parameter includes a numerical value of an arrangement gap between the first terminal and the second terminal, and the non-junction is not affirmative when the numerical value of the arrangement gap is not larger than a prescribed value.

19. The apparatus of claim 15, wherein one of the at least one calculation parameter includes a numerical value of the width of the first and second terminals, and the non-junction is affirmative when the numerical value of the width is not smaller than a prescribed value.

20. The apparatus of claim 15, wherein one of the at least one calculation parameters includes a numerical value of a difference in height of the first and second terminals, and the non-junction is affirmative when the numerical value of the difference in height is outside of a prescribed range.

21. The apparatus of claim 15, wherein the non-junction is affirmative when a peeling force of one of the first and second terminals is not smaller than a minimum pressing force.

22. The apparatus of claim 15, further comprising a display operable to display the numerical value of the at least one calculation parameter.

23. The apparatus of claim 15, further comprising a numerical value storing part operable to store a first flag with at least one calculation parameter which is allowed to be changed and a second flag with at least one calculation parameter which is not allowed to be changed.

* * * * *